United States Patent
Wang et al.

(10) Patent No.: US 11,121,159 B2
(45) Date of Patent: Sep. 14, 2021

(54) PIXEL STRUCTURE OF IMAGE SENSOR HAVING DIELECTRIC LAYER SURROUNDING PHOTO CONVERSION LAYER AND COLOR FILTER

(71) Applicant: Taiwan Semiconductor Manufacturing Company, Ltd., Hsinchu (TW)

(72) Inventors: Tzu-Jui Wang, Fengshan (TW); Keng-Yu Chou, Kaohsiung (TW); Chun-Hao Chuang, Hsinchu (TW); Ming-Chieh Hsu, Hsinchu (TW); Ren-Jie Lin, Tainan (TW); Jen-Cheng Liu, Hsinchu (TW); Dun-Nian Yaung, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/579,060

(22) Filed: Sep. 23, 2019

(65) Prior Publication Data

US 2020/0020729 A1    Jan. 16, 2020

Related U.S. Application Data

(60) Continuation of application No. 16/223,247, filed on Dec. 18, 2018, now Pat. No. 10,468,443, which is a division of application No. 15/088,238, filed on Apr. 1, 2016, now Pat. No. 10,177,186, which is a continuation of application No. 14/731,474, filed on Jun. 5, 2015, now Pat. No. 9,356,069, which is a division of application No. 14/014,488, filed on Aug. 30, 2013, now Pat. No. 9,064,989.

(51) Int. Cl.
  H01L 31/0232    (2014.01)
  H01L 27/146    (2006.01)

(52) U.S. Cl.
  CPC .... H01L 27/14621 (2013.01); H01L 27/1463 (2013.01); H01L 27/14627 (2013.01); H01L 27/14645 (2013.01); H01L 27/14665 (2013.01); H01L 27/14685 (2013.01); H01L 31/02327 (2013.01)

(58) Field of Classification Search
  None
  See application file for complete search history.

(56) References Cited

U.S. PATENT DOCUMENTS

| | | | |
|---|---|---|---|
| 7,741,667 B2 | 6/2010 | Jung | |
| 8,669,134 B2 | 3/2014 | Ito et al. | |
| 8,766,156 B2 | 7/2014 | Kawashima et al. | |
| 8,767,108 B2 | 7/2014 | Ogita et al. | |
| 9,064,989 B2 * | 6/2015 | Wang | H01L 27/14627 |

(Continued)

FOREIGN PATENT DOCUMENTS

JP    2008308602 A    12/2008

*Primary Examiner* — Hung K Vu
(74) *Attorney, Agent, or Firm* — Slater Matsil, LLP

(57) ABSTRACT

A photo diode includes a pixel unit, a photo conversion layer, and a dielectric layer. The pixel unit includes a pair of pixels. The photo conversion layer is above the pixel unit and has a pair of portions, each of which corresponds to a respective one of the pixels. The dielectric layer is between the portions of the photo conversion layer. A method of manufacturing the photo diode is also disclosed.

20 Claims, 17 Drawing Sheets

(56) References Cited

U.S. PATENT DOCUMENTS

| | | |
|---|---|---|
| 10,177,186 B2 * | 1/2019 | Wang ................ H01L 27/14645 |
| 2008/0308149 A1 | 12/2008 | Nomura et al. |
| 2009/0090976 A1 | 4/2009 | Kavalieros et al. |
| 2010/0060756 A1 | 3/2010 | Inuiya |
| 2011/0227091 A1 | 9/2011 | Toda |
| 2012/0009720 A1 | 1/2012 | Shim et al. |
| 2012/0075509 A1 | 3/2012 | Ito et al. |
| 2012/0235263 A1 * | 9/2012 | Ogita ................ H01L 27/14623 257/432 |
| 2012/0235266 A1 * | 9/2012 | Ootsuka ............ H01L 27/14623 257/432 |
| 2014/0016012 A1 * | 1/2014 | Oishi ................ H01L 27/1463 348/311 |
| 2014/0035082 A1 | 2/2014 | Chu et al. |
| 2014/0117482 A1 * | 5/2014 | Noda ................ H01L 27/14621 257/432 |

\* cited by examiner

PIXEL STRUCTURE OF IMAGE SENSOR HAVING DIELECTRIC LAYER SURROUNDING PHOTO CONVERSION LAYER AND COLOR FILTER

PRIORITY CLAIM AND CROSS-REFERENCE

This application is a continuation of U.S. patent application Ser. No. 16/223,247, filed on Dec. 18, 2018, entitled "Pixel Structure of Image Sensor and Method of Forming Same", which is a divisional of U.S. patent application Ser. No. 15/088,238, filed on Apr. 1, 2016, entitled "Pixel Structure of Image Sensor and Method of Forming Same", which is a continuation of U.S. patent application Ser. No. 14/731,474, filed on Jun. 5, 2015, now U.S. Pat. No. 9,356,069, issued May 31, 2016, entitled "Photo Diode and Method of Forming the Same", which is a divisional of U.S. patent application Ser. No. 14/014,488, filed Aug. 30, 2013, now U.S. Pat. No. 9,064,989, issued Jun. 23, 2015, entitled "Photo Diode and Method of Forming the Same" all of which are incorporated herein by reference in their entirety.

FIELD

The technology described in this patent document generally relates to semiconductor processes, and, more particularly, to a photo diode and a method of forming a photo diode.

BACKGROUND

As photo-electronic technology improves, products using image technology, such as the digital cameras, scanners, and video cameras, have become more popular. In the manufacturing process of image sensors, photo diodes are capable of sensing different colors such as red, green, and blue by means of color filters. Typically, each of the photo diodes senses a specific color only. However, conventional photo diode architecture may suffer serious cross-talk issues because light received from a tilt angle may interfere with adjacent pixels.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
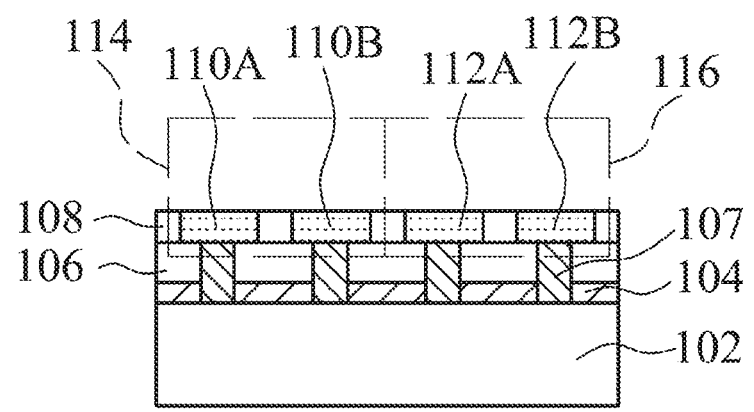
FIGS. 1-6 are exemplary diagrams during a sequence of processing stages for forming a photo diode according to a first embodiment of the invention.

FIGS. 1-6 are exemplary diagrams during a sequence of processing stages for forming a photo diode according to a first embodiment of the invention. As shown in FIG. 1, a read circuit 102 over a substrate (not shown) may be provided in a photo diode 100. A capping layer 104 for protecting vias 107 in the back end of line process may be provided over the read circuit 102. The capping layer 104 may be, for example, silicon nitride or silicon carbide. The vias 107 may be, for example, aluminum-copper or copper. A first dielectric layer 106 for electric isolation between the first pair of electrodes 110A, 110B and the second pair of electrodes 112A, 112B and other metal layers (not shown) in the back end of line process may be provided over the capping layer 104. A second dielectric layer 108 for electric isolation between the electrodes 110A, 110B, 112A, 112B may be provided over the first dielectric layer 106. The dielectric layers 106, 108 may be, for example, oxide or other isolation materials. The first pair of electrodes 110A, 110B and the second pair of electrodes 112A, 112B may be any metal or alloy, such as, aluminum-copper and copper. The first pair of electrodes 110A, 110B may correspond to a first pixel 114, and the second pair of electrodes 112A, 112B may correspond to a second pixel 116. The first pair of electrodes 110A, 110B and the second pair of electrodes 112A, 112B may be formed by the same conductive layer. The first pair of electrodes 110A, 110B may include a first positive electrode 110A and a first negative electrode 110B, and the second pair of electrodes 112A, 112B may include a second positive electrode 112A and a second negative electrode 112B.

Figure 2:
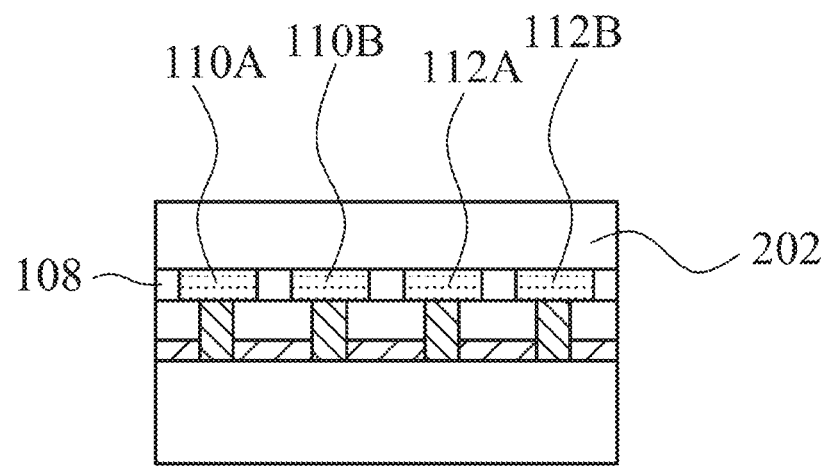

As shown in FIG. 2, a third dielectric layer 202 may be provided on the second dielectric layer 108 and the first pair of electrodes 110A, 110B and the second pair of electrodes 112A, 112B. The third dielectric layer 202 may be also provided over the substrate (not shown).

Figure 3:
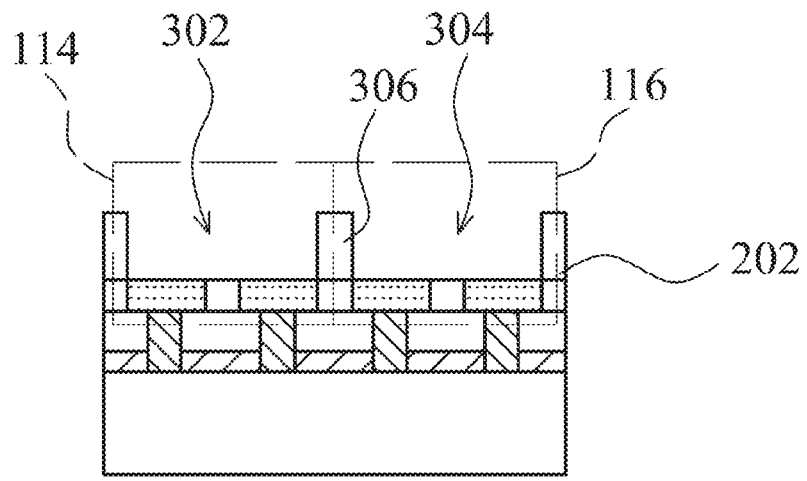

As shown in FIG. 3, a mask (not shown) may be used to define an etching region for the third dielectric layer 202. A portion of the third dielectric layer 202 may be removed by, for example, a dry etching process to form a first grid 302 corresponding to the first pixel 114 and a second grid 304 corresponding to the second pixel 116. The first grid 302 and the second grid 304 may be separated by a portion 306 of the third dielectric layer 202.

Figure 4:
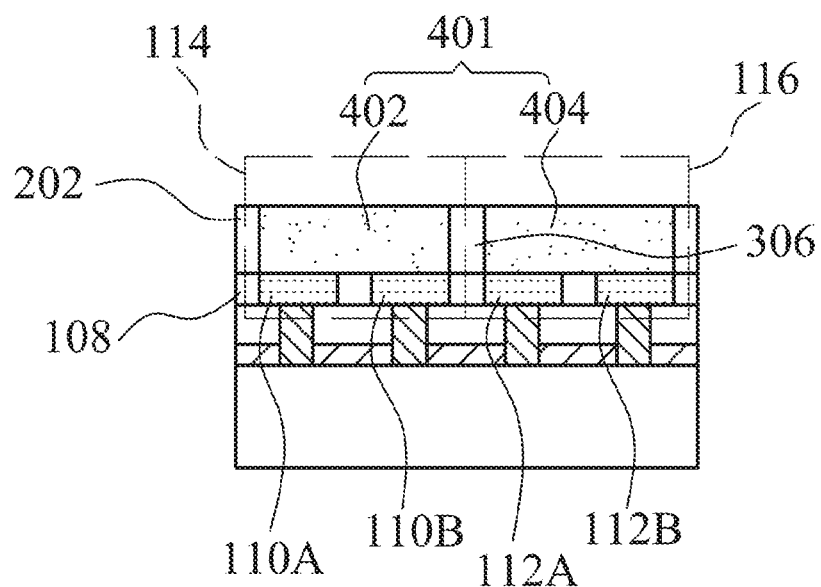

As shown in FIG. 4, a photo conversion layer 401 may be formed on the second dielectric layer 108 and the first pair of electrodes 110A, 110B and the second pair of electrodes 112A, 112B. The portion 306 of the third dielectric layer 202 defines a first portion 402 of the photo conversion layer 401 corresponding to a first pixel 114 from a second portion 404 of the photo conversion layer 401 corresponding to the second pixel 116. The photo conversion layer 401 may be organic films, such as Phenyl-C61-butyric acid methyl ester (PCBM) or poly(3-hexylthiophene) (P3HT). The refractive index of the third dielectric layer 202 is lower than the refractive index of the photo conversion layer 401. For example, the refractive index of the photo conversion layer 401 may be about 1.6 to 2, while the refractive index of the third dielectric layer 202 may be smaller than 1.5. In an embodiment of the invention, the thickness of the photo conversion layer 401 may be 100 nanometers to several micrometers.

Figure 5:
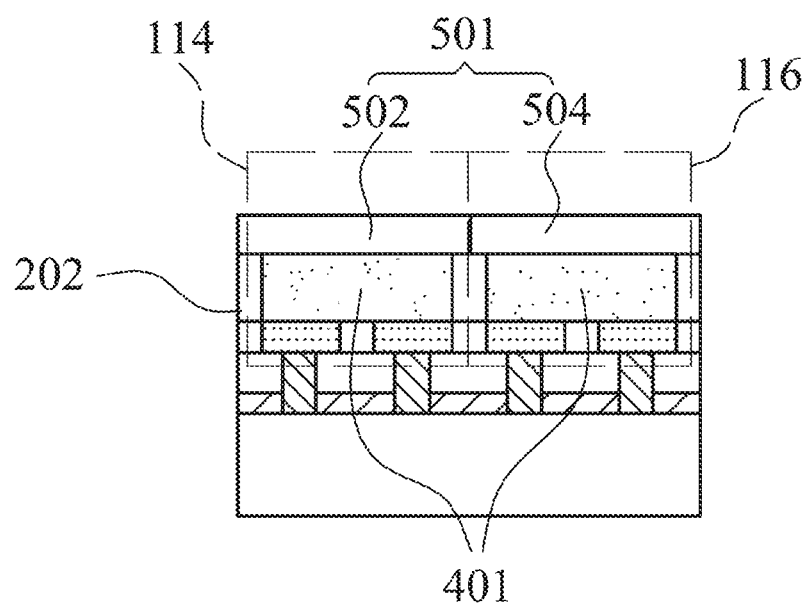

As shown in FIG. 5, a color filter layer 501 may be formed over the photo conversion layer 401. In an embodiment of the invention, a first portion 502 of the color filter layer 501 corresponding to the first pixel 114 may be formed by a red filter process; and a second portion 504 of the color filter layer 501 corresponding to the second pixel 116 may be formed by a green filter process. In an embodiment of the invention, the thickness of the color filter layer 501 may be 0.3 micrometers to 1 micrometers.

Figure 6:
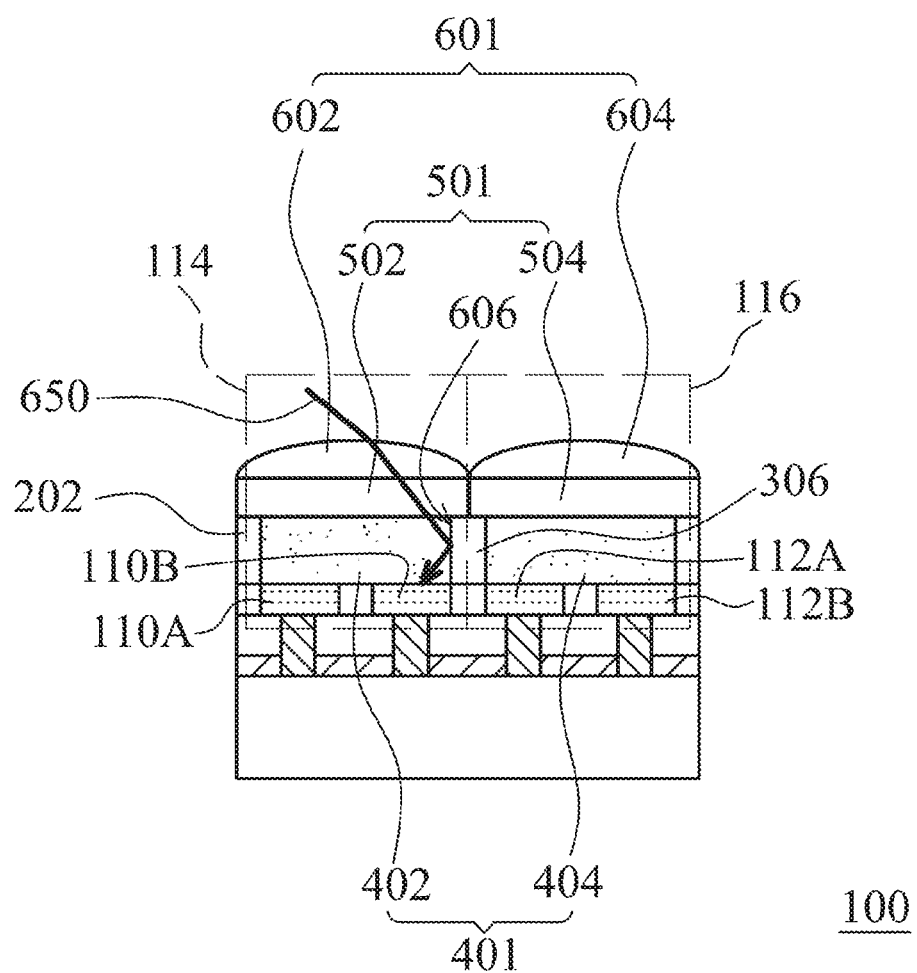

As shown in FIG. 6, a micro lens layer 601 may be formed over the color filter layer 501. A first portion 602 of the micro lens layer 601 may correspond to the first pixel 114, and a second portion 604 of the micro lens layer 601 may correspond to the second pixel 116. In an embodiment of the invention, the photo diode 100 is formed. In the first pixel 114, bias voltage between the first pair of electrodes 110A, 110B may be applied to trigger an electric field that enhances the electrodes 110A, 110B in the collection of holes or electrons converted by the first portion 402 of the photo conversion layer 401. Also, in the second pixel 116, bias voltage between the second pair of electrodes 112A, 112B may be applied to trigger an electric field that enhances the electrodes 112A, 112B in the collection of holes or electrons converted by the second portion 404 of the photo conversion layer 401.

Light through the first portion 602 of the micro lens layer 601, the first portion 502 of the color filter layer 501, and the first portion 402 of the photo conversion layer 401 may not pass through the second portion 404 of the photo conversion layer 401 because the portion 306 of third dielectric layer 202 separating the photo conversion layer 401 may change the direction of light.

Total internal reflection may occur and is a phenomenon that happens when a propagating wave strikes a medium boundary at an angle larger than a particular critical angle with respect to the normal to the surface. For example, according to the formula $$\theta_c = \arcsin\frac{n_2}{n_1},$$

assuming that the refractive index (corresponding to n1 in this case) of the photo conversion layer 401 is 2 and the refractive index (corresponding to n2 in this case) of the third dielectric layer 202 is 1.5, the critical angle may be about 49 degrees.

When light 650 strikes the boundary between the photo conversion layer 401 and the portion 306 of the third dielectric layer 202 at an angle larger than the critical angle (49 degrees) with respect to the normal to the lateral surface 606 of the third dielectric layer 202, light 650 cannot pass through the portion 306 of the third dielectric layer 202 and is reflected. Therefore, light 650 through the first portion 502 of the color filter layer 501 corresponding to the first pixel 114 may not pass through the second portion 404 of the photo conversion layer 401 corresponding to the second pixel 116. The second pair of electrodes 112A, 112B corresponding to the second pixel 116 may not receive holes or electrons converted from light 650 through the first pixel 114. In an embodiment of the invention, crosstalk of light between the pixels 114, 116 in the photo diode 100 may be reduced.

Figure 7:
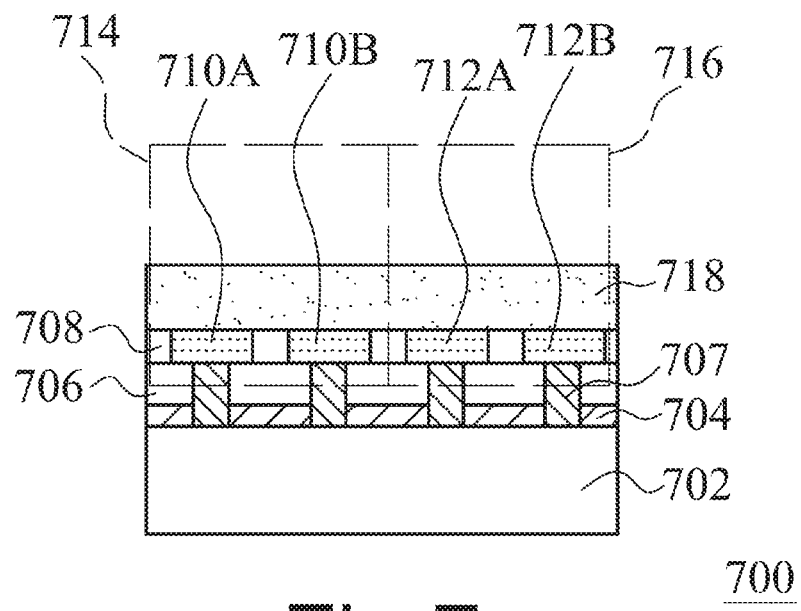
FIGS. 7-11 are exemplary diagrams during a sequence of processing stages for forming a photo diode according to a second embodiment of the invention.

FIGS. 7-11 are exemplary diagrams during a sequence of processing stages for forming a photo diode according to a second embodiment of the invention. As shown in FIG. 7, a read circuit 702 over a substrate (not shown) may be provided in the photo diode 700. A capping layer 704 for protecting vias 707 in the back end of line process may be provided over the read circuit 702. The capping layer 704 may be, for example, silicon nitride or silicon carbide. The vias 707 may be, for example, aluminum-copper or copper. A first dielectric layer 706 for electric isolation between bottom electrodes 810, 812 and other metal layers (not shown) in the back end of line process may be provided over the capping layer 804. A second dielectric layer 708 for electric isolation between the electrodes 710A, 710B, 712A, 712B may be provided over the first dielectric layer 706. The dielectric layers 706, 708 may be, for example, oxide or other isolation materials. The first pair of electrodes 710A, 710B and the second pair of electrodes 712A, 712B may be any metal or alloy, such as, aluminum-copper and copper. The first pair of electrodes 710A, 710B may correspond to a first pixel 714, and the second pair of electrodes 712A, 712B may correspond to a second pixel 716. The first pair of electrodes 710A, 710B and the second pair of electrodes 712A, 712B may be formed by the same conductive layer. The first pair of electrodes 710A, 710B may include a first positive electrode 710A and a first negative electrode 710B, and the second pair of electrodes 712A, 712B may include a second positive electrode 712A and a second negative electrode 712B.

A photo conversion layer 718 may be formed on the dielectric layer 708, the first pair of electrodes 710A, 710B and the second pair of electrodes 712A, 712B. The photo conversion layer 718 may be organic films, such as Phenyl-C61-butyric acid methyl ester (PCBM) or poly(3-hexylthiophene) (P3HT).

Figure 8:
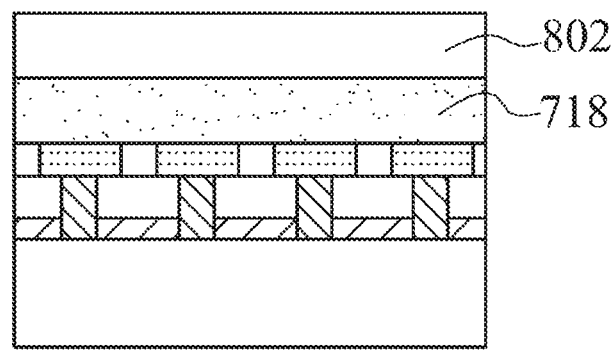
Figure 9:
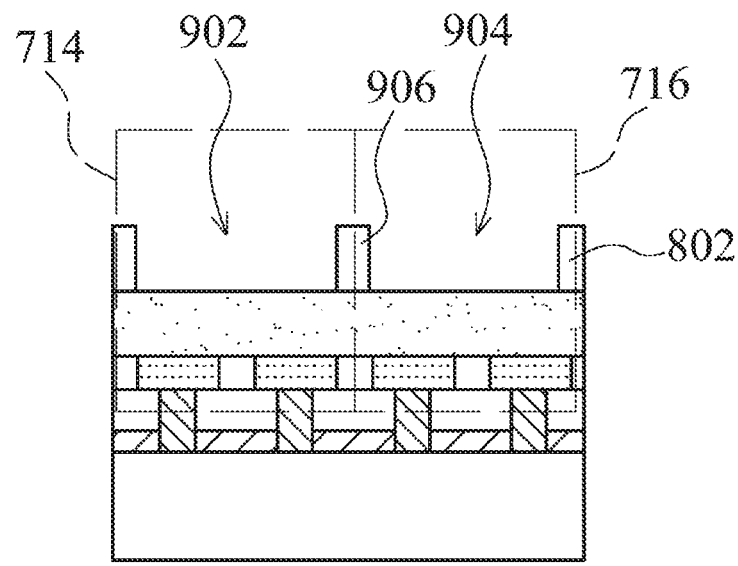

As shown in FIG. 8, a third dielectric layer 802 may be provided on the photo conversion layer 718. As shown in FIG. 9, a mask (not shown) may be used to define an etching region for the third dielectric layer 802. A portion of the third dielectric layer 802 may be removed by, for example, a dry etching process to form a first grid 902 corresponding to the first pixel 714 and a second grid 904 corresponding to the second pixel 716. The first grid 902 and the second grid 904 may be separated by a portion 906 of the dielectric layer 802.

Figure 10:
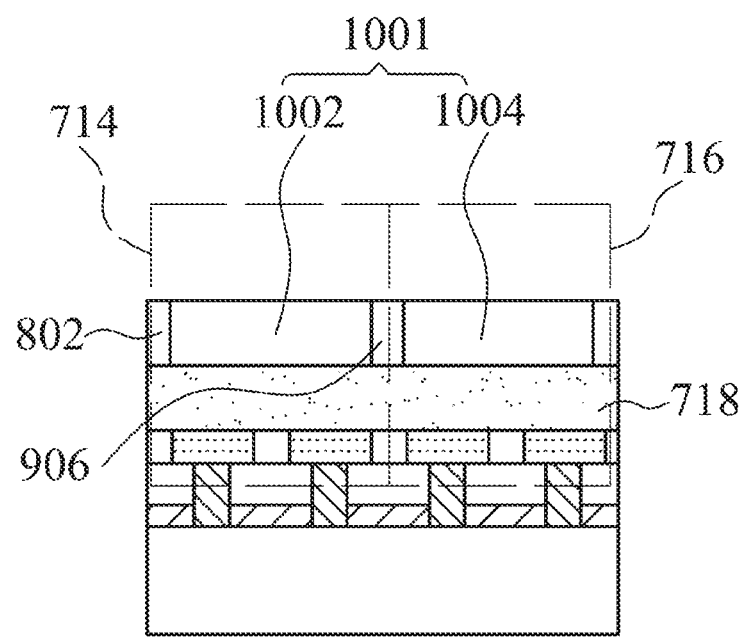

As shown in FIG. 10, a color filter layer 1001 may be formed on the photo conversion layer 718. In an embodiment of the invention, a first portion 1002 of the color filter layer 1001 corresponding to the first pixel 714 may be formed by a red filter process; and a second portion 1004 of the color filter layer 1001 corresponding to the second pixel 716 may be formed by a green filter process. In an embodiment of the invention, the thickness of the color filter layer 1001 may be 0.3 micrometers to 1 micrometers.

The portion 906 of the dielectric layer 802 defines the first portion 1002 of the color filter layer 1001 corresponding to the first pixel 714 from the second portion 1004 of the color filter layer 1001 corresponding to the second pixel 716. The refractive index of the third dielectric layer 802 may be lower than the refractive index of the color filter layer 1001. For example, the refractive index of the color filter layer 1001 may be about 1.6 to 2, while the refractive index of the third dielectric layer 802 may be smaller than 1.5.

Figure 11:
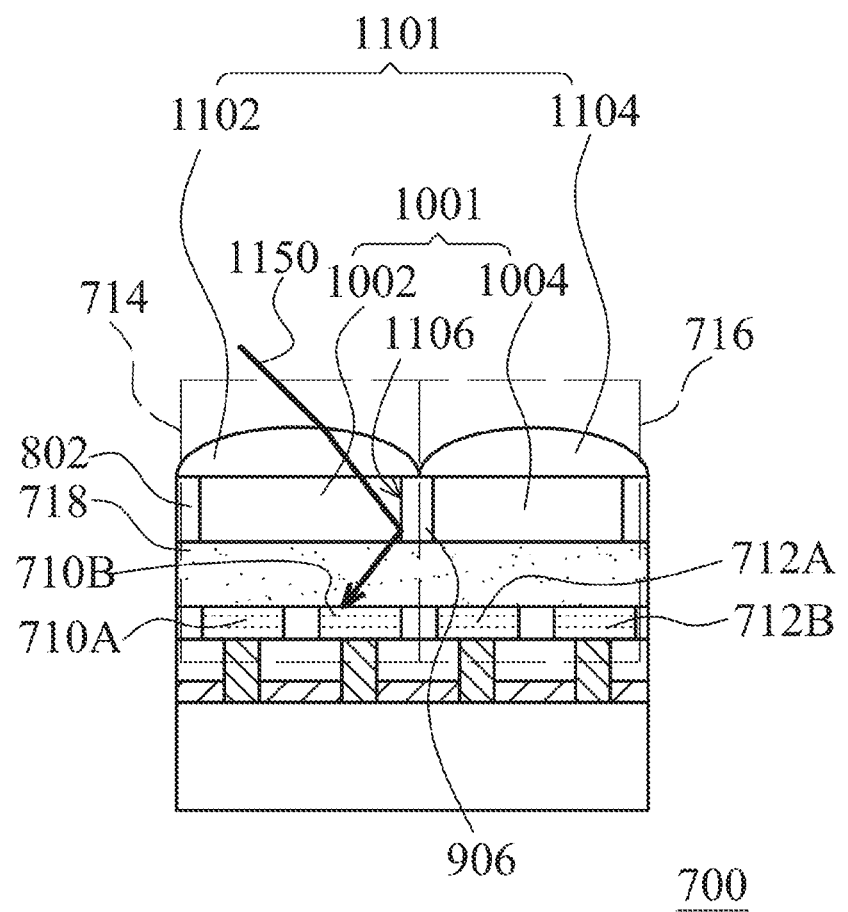

As shown in FIG. 11, a micro lens layer 1101 may be formed over the color filter layer 1001. A first portion 1102 of the micro lens layer 1101 may correspond to the first pixel 714, and a second portion 1104 of the micro lens layer 1101 may correspond to the second pixel 716. In an embodiment of the invention, the photo diode 700 is formed. In the first pixel 714, bias voltage between the first pair of electrodes 710A, 710B may be applied to trigger an electric field that enhances the electrodes 710A, 710B in the collection of holes or electrons converted by the photo conversion layer 718. Also, in the second pixel 716, bias voltage between the second pair of electrodes 712A, 712B may be applied to trigger an electric field that enhances the electrodes 712A, 712B in the collection of holes or electrons converted by the photo conversion layer 718.

Light through the first portion 1102 of the micro lens layer 1101 and the first portion 1002 of the color filter layer 1001 may not pass through the second portion 1004 of the color filter layer 1001 because the portion 906 of third dielectric layer 802 separating the color filter layer 1001 may change the direction of light.

Total internal reflection may occur and is a phenomenon that happens when a propagating wave strikes a medium boundary at an angle larger than a particular critical angle with respect to the normal to the surface. For example, according to the formula $$\theta_c = \arcsin\frac{n_2}{n_1},$$

assuming that the refractive index (corresponding to n1 in this case) of the color filter layer 1001 is 2 and the refractive index (corresponding to n2 in this case) of the third dielectric layer 802 is 1.5, the critical angle may be about 49 degrees. When light 1150 strikes the boundary between the color filter layer 1001 and the portion 1006 of third dielectric layer 802 at an angle larger than the critical angle (49 degrees) with respect to the normal to the lateral surface 1106 of the third dielectric layer 802, light 1150 cannot pass through the portion 1006 of third dielectric layer 802 and is reflected.

Therefore, light 1150 through the first portion 1002 of the color filter layer 1001 corresponding to the first pixel 714 may not pass through a portion of photo conversion layer 718 corresponding to the second pixel 716. The second pair of electrodes 712A, 712B corresponding to the second pixel 716 may not receive holes or electrons converted from light 1150 through the first pixel 714. In an embodiment of the invention, crosstalk of light between the pixels 714, 716 in the photo diode 700 may be reduced.

Figure 12:
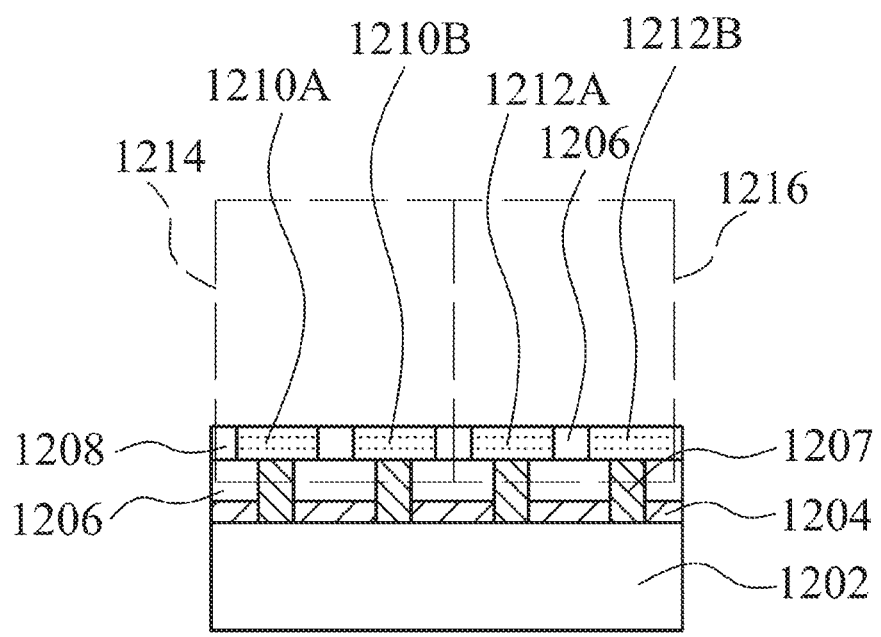
FIGS. 12-17 are exemplary diagrams during a sequence of processing stages for forming a photo diode according to a third embodiment of the invention.

FIGS. 12-17 are exemplary diagrams during a sequence of processing stages for forming a photo diode according to a third embodiment of the invention. As shown in FIG. 12, a read circuit 1202 over a substrate (not shown) may be provided in a photo diode 1200. A capping layer 1204 for protecting vias 1207 in the back end of line process may be provided over the read circuit 1202. The capping layer 1204 may be, for example, silicon nitride or silicon carbide. The vias 1207 may be, for example, aluminum-copper or copper. A first dielectric layer 1206 for electric isolation between the first pair of electrodes 1210A, 1210B and the second pair of electrodes 1212A, 1212B and other metal layers (not shown) in the back end of line process may be provided over the capping layer 1204. A second dielectric layer 1208 for electric isolation between the electrodes 1210A, 1210B, 1212A, 1212B may be provided over the first dielectric layer 1206. The dielectric layers 1206, 1208 may be, for example, oxide or other isolation materials. The first pair of electrodes 1210A, 1210B and the second pair of electrodes 1212A, 1212B may be any metal or alloy, such as, aluminum-copper and copper. The first pair of electrodes 1210A, 1210B may correspond to a first pixel 1214, and the second pair of electrodes 1212A, 1212B may correspond to a second pixel 1216. The first pair of electrodes 1210A, 1210B and the second pair of electrodes 1212A, 1212B may be formed by the same conductive layer. The first pair of electrodes 1210A, 1210B may include a first positive electrode 1210A and a first negative electrode 1210B, and the second pair of electrodes 1212A, 1212B may include a second positive electrode 1212A and a second negative electrode 1212B.

Figure 13:
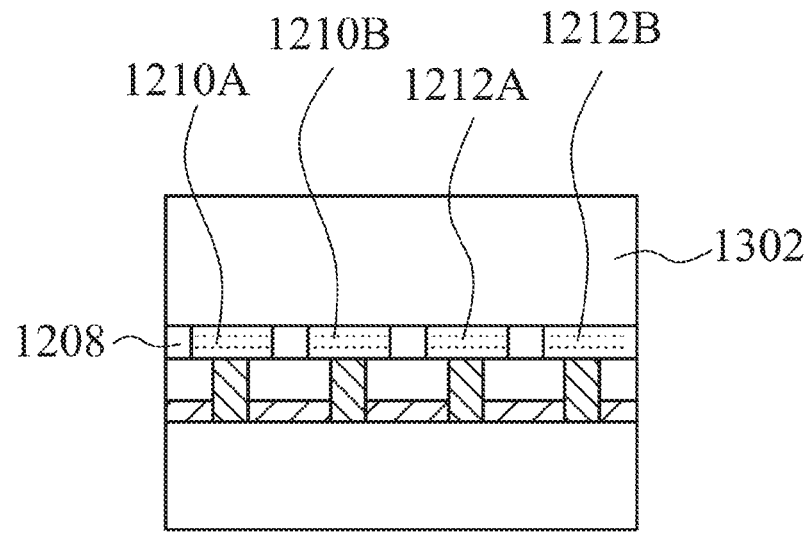

As shown in FIG. 13, a third dielectric layer 1302 may be provided on the second dielectric layer 1208 and the first pair of electrodes 1210A, 1210B and the second pair of electrodes 1212A, 1212B. The third dielectric layer 1302 may be also provided over the substrate (not shown).

Figure 14:
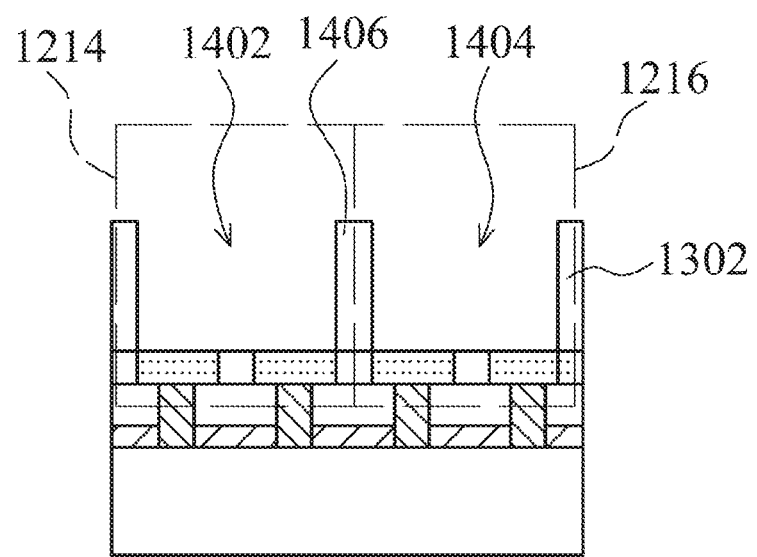

As shown in FIG. 14, a mask (not shown) may be used to define an etching region for the third dielectric layer 1302. A portion of the third dielectric layer 1302 may be removed by, for example, a dry etching process to form a first grid 1402 corresponding to the first pixel 1214 and a second grid 1404 corresponding to the second pixel 1216. The first grid 1402 and the second grid 1404 may be separated by a portion 1406 of the third dielectric layer 1302.

Figure 15:
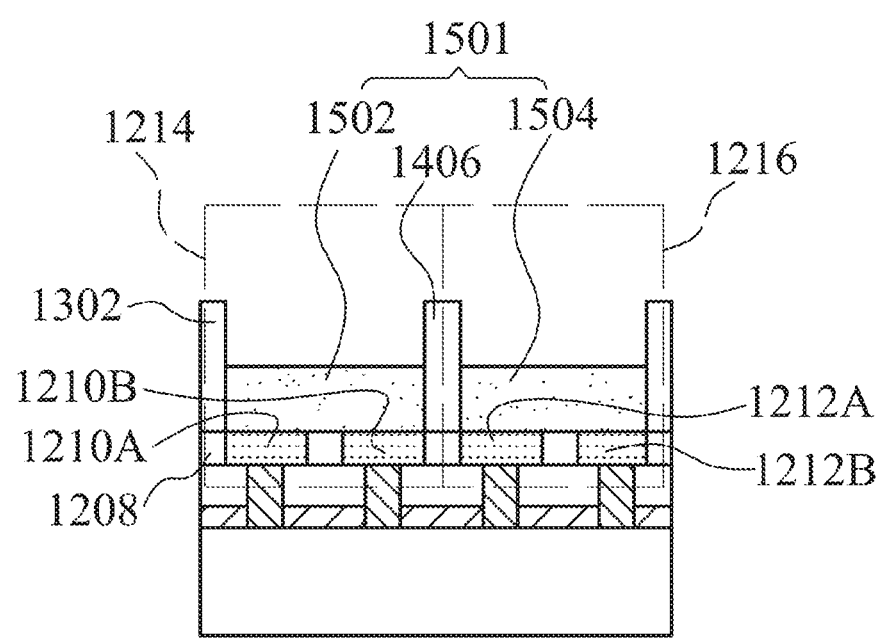

As shown in FIG. 15, a photo conversion layer 1501 may be formed on the second dielectric layer 1208 and the first pair of electrodes 1210A, 1210B and the second pair of electrodes 1212A, 1212B. The portion 1406 of the third dielectric layer 1302 defines a first portion 1502 of the photo conversion layer 1501 corresponding to the first pixel 1214 from a second portion 1504 of the photo conversion layer 1501 corresponding to the second pixel 1216. The photo conversion layer 1501 may be organic films, such as Phenyl-C61-butyric acid methyl ester (PCBM) or poly(3-hexylthiophene) (P3HT). The refractive index of the third dielectric layer 1302 is lower than the refractive index of the photo conversion layer 1501. For example, the refractive index of the photo conversion layer 1501 may be about 1.6 to 2, while the refractive index of the third dielectric layer 1302 may be smaller than 1.5. In an embodiment of the invention, the thickness of the photo conversion layer 1501 may be 100 nanometers to several micrometer.

Figure 16:
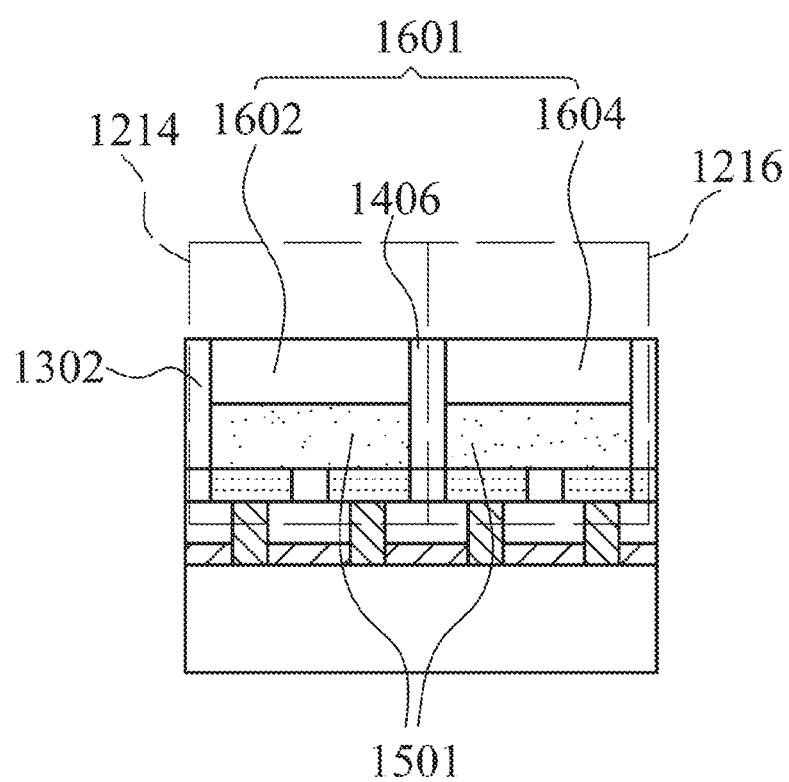

As shown in FIG. 16, a color filter layer 1601 may be formed on the photo conversion layer 1501. In an embodiment of the invention, a first portion 1602 of the color filter layer 1601 corresponding to the first pixel 1214 may be formed by a red filter process; and a second portion 1604 of the color filter layer 1601 corresponding to the second pixel 1216 may be formed by a green filter process. In an embodiment of the invention, the thickness of the color filter layer 1601 may be 0.3 micrometers to 1 micrometers.

The portion 1406 of the third dielectric layer 1302 defines a first portion 1602 of the color filter layer 1601 corresponding to the first pixel 1214 from a second portion 1604 of the color filter layer 1601 corresponding to the second pixel 1216. The refractive index of the third dielectric layer 1302 is lower than the refractive index of the color filter layer 1601. For example, the refractive index of the color filter layer 1601 may be about 1.6 to 2, while the refractive index of the third dielectric layer 1302 may be smaller than 1.5.

Figure 17:
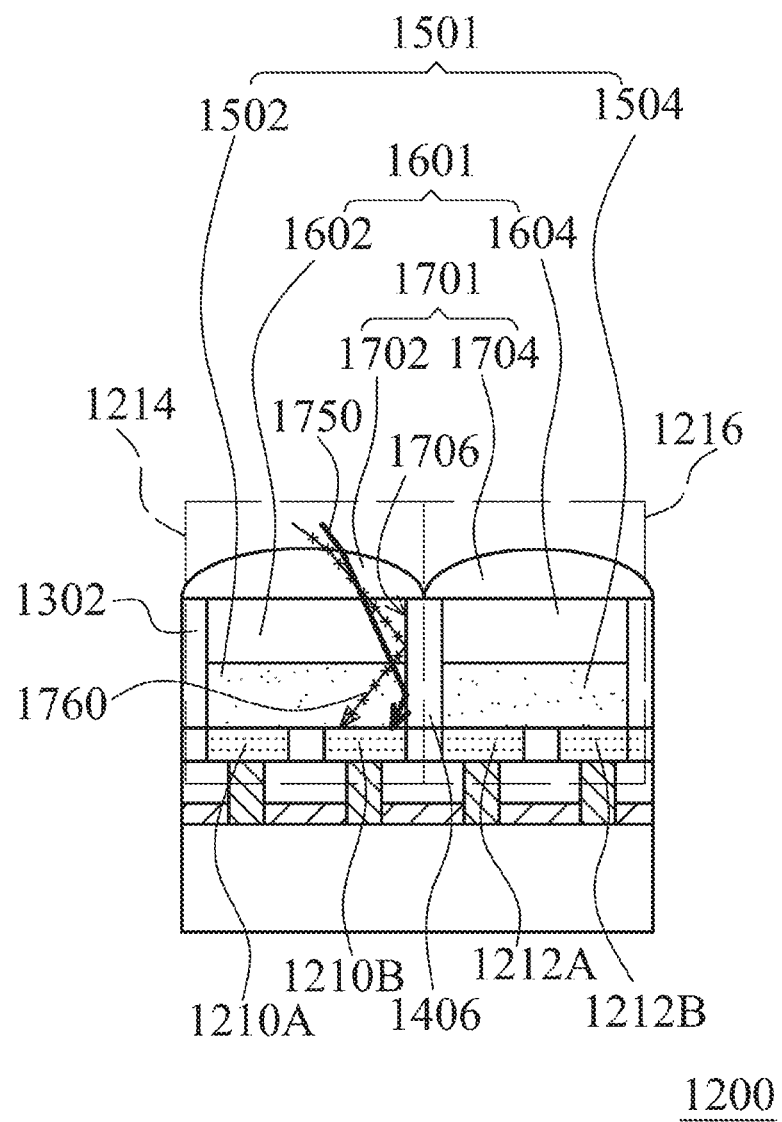

As shown in FIG. 17, a micro lens layer 1701 is formed over the color filter layer 1601. A first portion 1702 of the micro lens layer 1701 may correspond to a first pixel 1214, and the second portion 1704 of the micro lens layer 1701 may correspond to a second pixel 1216. In an embodiment of the invention, the photo diode 1200 is formed. In the first pixel 1214, bias voltage between the first pair of electrodes 1210A, 1210B may be applied to trigger an electric field that enhances the electrodes 1210A, 1210B in the collection of holes or electrons converted by the first portion 1502 of the photo conversion layer 1501. Also, in the second pixel 716, bias voltage between the second pair of electrodes 1212A, 1212B may be applied to trigger an electric field that enhances the electrodes 1212A, 1212B in the collection of holes or electrons converted by the second portion 1504 of the photo conversion layer 1501.

Light through the first portion 1702 of the micro lens layer 1701, the first portion 1602 of the color filter layer 1601 and the first portion 1502 of the photo conversion layer 1501 may not pass through the second portion 1504 of the photo conversion layer 1501 because the portion 1406 of third dielectric layer 1302 separating the photo conversion layer 1501 may change the direction of the light.

Total internal reflection may occur and is a phenomenon that happens when a propagating wave strikes a medium boundary at an angle larger than a particular critical angle with respect to the normal to the surface. For example, according to the formula $$\theta_c = \arcsin\frac{n_2}{n_1},$$

assuming that the refractive index (corresponding to n1 in this case) of the photo conversion layer 1501 is 2 and the refractive index (corresponding to n2 in this case) of the third dielectric layer 1302 is 1.5, the critical angle may be about 49 degrees. When light 1750 strikes the boundary between the photo conversion layer 1501 and the portion 1406 of third dielectric layer 1302 at an angle larger than the critical angle (49 degrees) with respect to the normal to the lateral surface 1706 of the third dielectric layer 1302, light 1750 cannot pass through the portion 1406 of third dielectric layer 1302 and is reflected. Therefore, light 1750 through the first portion 1502 of the color filter layer 1501 corresponding to the first pixel 1214 may not pass through the second portion 1504 of the photo conversion layer 1501 corresponding to the second pixel 1216. The second pair of electrodes 1212A, 1212B corresponding to the second pixel 1216 may not receive holes or electrons converted from light 1750 through the first pixel 1214. In an embodiment of the invention, crosstalk of light between the pixels 1214, 1216 in the photo diode 1200 may be reduced.

Light through the first portion 1702 of the micro lens layer 1701 and the first portion 1602 of the color filter layer 1601 may not pass through the second portion 1604 of the color filter layer 1601 because the portion 1406 of third dielectric layer 1302 separating the color filter layer 1001 may change the direction of light.

In an embodiment of the invention, according to the formula $$\theta_c = \arcsin\frac{n_2}{n_1},$$

assuming that the refractive index (corresponding to n1 in this case) of the color filter layer 1601 is 2 and the refractive index (corresponding to n2 in this case) of the third dielectric layer 1302 is 1.5, the critical angle may be about 49 degrees. When light 1760 strikes the boundary between the color filter layer 1601 and the portion 1406 of third dielectric layer 1302 at an angle larger than the critical angle (49 degrees) with respect to the normal to the lateral surface 1706 of the third dielectric layer 1302, light 1760 cannot pass through the portion 1406 of the third dielectric layer 1302 and is reflected.

Therefore, light 1760 through the first portion 1602 of the color filter layer 1601 corresponding to the first pixel 1214 may not pass through the second portion 1504 of the photo conversion layer 1501 corresponding to the second pixel 1216. The second pair of electrodes 1212A, 1212B corresponding to the second pixel 1216 may not receive holes or electrons converted from light 1760 through the first pixel 1214. In an embodiment of the invention, crosstalk of light between the pixels 1214, 1216 in the photo diode 1200 may be also reduced.

Figure 18:
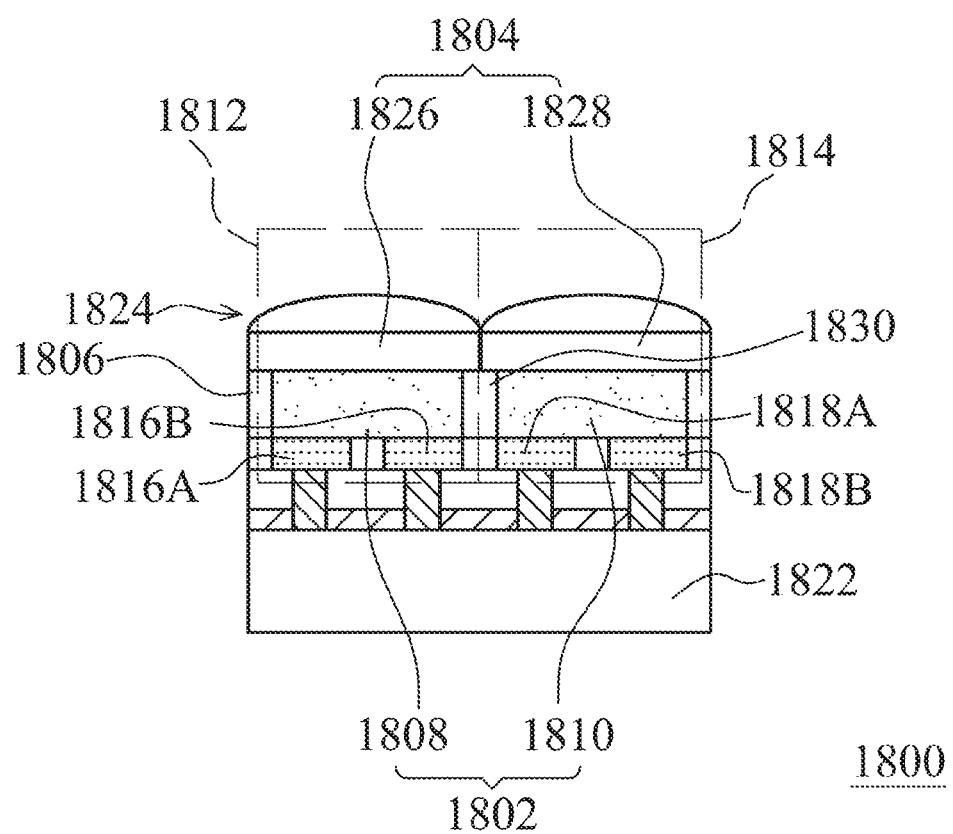
FIG. 18 is an exemplary diagram for a photo diode according to a first embodiment of the invention.

FIG. 18 is an exemplary diagram for a photo diode according to a first embodiment of the invention. As shown in FIG. 18, a photo diode 1800 may include a substrate (not shown), a photo conversion layer 1802, a color filter layer 1804 and a dielectric layer 1806. The photo conversion layer 1802 is disposed over the substrate (not shown). The color filter layer 1804 is disposed over the photo conversion layer 1802. A portion 1830 of the dielectric layer 1806 defines a first portion 1808 of the photo conversion layer 1802 corresponding to a first pixel 1812 from a second portion 1810 of the photo conversion layer 1802 corresponding to a second pixel 1814. The refractive index of the dielectric layer 1806 may be lower than the refractive index of the photo conversion layer 1802.

In an embodiment of the invention, the photo diode 1800 further includes a first pair of electrodes 1816A, 1816B and a second pair of electrodes 1818A, 1818B disposed over the substrate (not shown). The first pair of electrodes 1816A, 1816B may correspond to the first pixel 1812, and the second pair of electrodes 1818A, 1818B may correspond to the second pixel 1814. In an embodiment of the invention, the photo conversion layer 1802 is an organic film layer. In an embodiment of the invention, the photo diode 1800 further includes a read out circuit 1822. The read out circuit 1822 is disposed over the substrate (not shown). In an embodiment of the invention, the photo diode 1800 further includes a micro lens layer 1824. The micro lens layer 1824 is disposed over the color filter layer 1804. In an embodiment of the invention, a first portion 1826 of the color filter layer 1804 corresponding to the first pixel 1812 is a red filter, and a second portion 1828 of the color filter layer 1804 corresponding to the second pixel 1814 is a green filter. In an embodiment of the invention, the dielectric layer 1806 includes a first grid corresponding to the first pixel 1812 and a second grid corresponding to the second pixel 1814. In an embodiment of the invention, the first pair of electrodes 1816A, 1816B may include a first positive electrode 1816A and a first negative electrode 1816B, and the second pair of electrodes 1818A, 1818B may include a second positive electrode 1818A and a second negative electrode 1818B.

Figure 19:
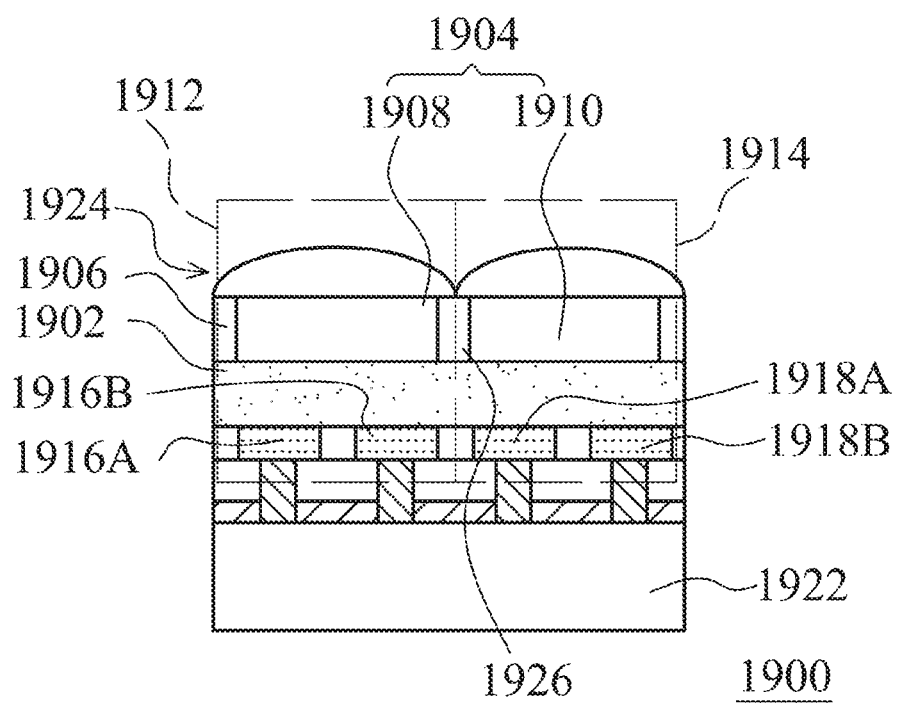
FIG. 19 is an exemplary diagram for a photo diode according to a second embodiment of the invention.

FIG. 19 is an exemplary diagram for a photo diode according to a second embodiment of the invention. As shown in FIG. 19, another photo diode 1900 includes a substrate (not shown), a photo conversion layer 1902, a color filter layer 1904 and a dielectric layer 1906. The photo conversion layer 1902 is disposed over the substrate (not shown). The color filter layer 1904 is disposed over the photo conversion layer 1902. A portion 1926 of the dielectric layer 1906 defines a first portion 1908 of the color filter layer 1904 corresponding to a first pixel 1912 from a second portion 1910 of the color filter layer 1904 corresponding to a second pixel 1914. The refractive index of the dielectric layer 1906 is lower than the refractive index of the color filter layer 1904.

In an embodiment of the invention, the photo diode 1900 further includes a first pair of electrodes 1916A, 1916B and a second pair of electrodes 1918A, 1918B disposed over the substrate (not shown). The first pair of electrodes 1916A, 1916B may correspond to the first pixel 1912, and the second pair of electrodes 1918A, 1918B may correspond to the second pixel 1914. In an embodiment of the invention, the photo conversion layer 1902 is an organic film layer. In an embodiment of the invention, the photo diode 1900 further includes a read out circuit 1922. The read out circuit 1922 is disposed over the substrate (not shown). In an embodiment of the invention, the photo diode 1900 further includes a micro lens layer 1924. The micro lens layer 1924 is disposed over the color filter layer 1904. In an embodiment of the invention, the first portion 1908 of the color filter layer 1904 corresponding to the first pixel 1912 is a red filter, and the second portion 1910 of the color filter layer 1904 corresponding to the second pixel 1914 is a green filter. In an embodiment of the invention, the dielectric layer 1906 includes a first grid corresponding to the first pixel 1912 and a second grid corresponding to the second pixel 1914. In an embodiment of the invention, the first pair of electrodes 1916A, 1916B may include a first positive electrode 1916A and a first negative electrode 1916B, and the second pair of electrodes 1918A, 1918B may include a second positive electrode 1918A and a second negative electrode 1918B.

Figure 20:
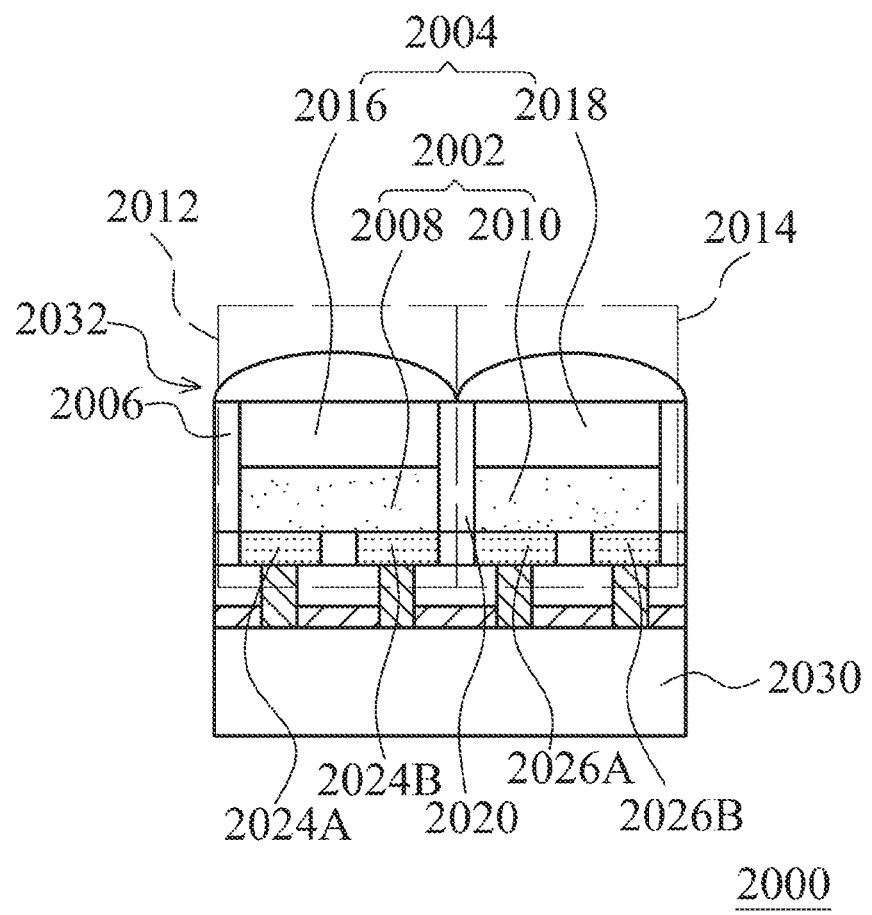
FIG. 20 is an exemplary diagram for a photo diode according to a third embodiment of the invention.

FIG. 20 is an exemplary diagram for a photo diode according to a third embodiment of the invention. As shown in FIG. 20, another photo diode 2000 includes a substrate (not shown), a photo conversion layer 2002, a color filter layer 2004 and a dielectric layer 2006. The photo conversion layer 2002 is disposed over the substrate (not shown). The color filter layer 2004 is disposed over the photo conversion layer 2002. A portion 2020 of the dielectric layer 2006 defines a first portion 2008 of the photo conversion layer 2002 corresponding to a first pixel 2012 from a second portion 2010 of the photo conversion layer 2002 corresponding to a second pixel 2014. The refractive index of the dielectric layer 2006 is lower than the refractive index of the photo conversion layer 2002 and the refractive index of the color filter layer 2004. The portion 2020 of the dielectric layer 2006 also defines a first portion 2016 of the color filter layer 2004 corresponding to the first pixel 2012 from a second portion 2018 of the color filter layer 2004 corresponding to the second pixel 2014.

In an embodiment of the invention, the photo diode 2000 further includes a first pair of electrodes 2024A, 2024B and a second pair of electrodes 2026A, 2026B disposed over the substrate (not shown). The first pair of electrodes 2024A, 2024B may correspond to the first pixel 2012, and the second pair of electrodes 2026A, 2026B may correspond to the second pixel 2014. In an embodiment of the invention, the photo conversion layer 2002 is an organic film layer. In an embodiment of the invention, the photo diode 2000 further includes a read out circuit 2030. The read out circuit 2030 is disposed over the substrate (not shown). In an embodiment of the invention, the photo diode 2000 further includes a micro lens layer 2032. The micro lens layer 2032 is disposed over the color filter layer 2004. In an embodiment of the invention, a first portion 2016 of the color filter layer 2004 corresponding to the first pixel 2012 is a red filter, and the second portion 2018 of the color filter layer 2004 corresponding to the second pixel 2014 is a green filter. In an embodiment of the invention, the dielectric layer 2006 includes two grids. Each of the grids the dielectric layer 2006 respectively may correspond to the first pixel 2012 and the second pixel 2014. In an embodiment of the invention, the first pair of electrodes 2024A, 2024B may include a first positive electrode 2024A and a first negative electrode 2024B, and the second pair of electrodes 2026A, 2026B may include a second positive electrode 2026A and a second negative electrode 2026B.

Figure 21:
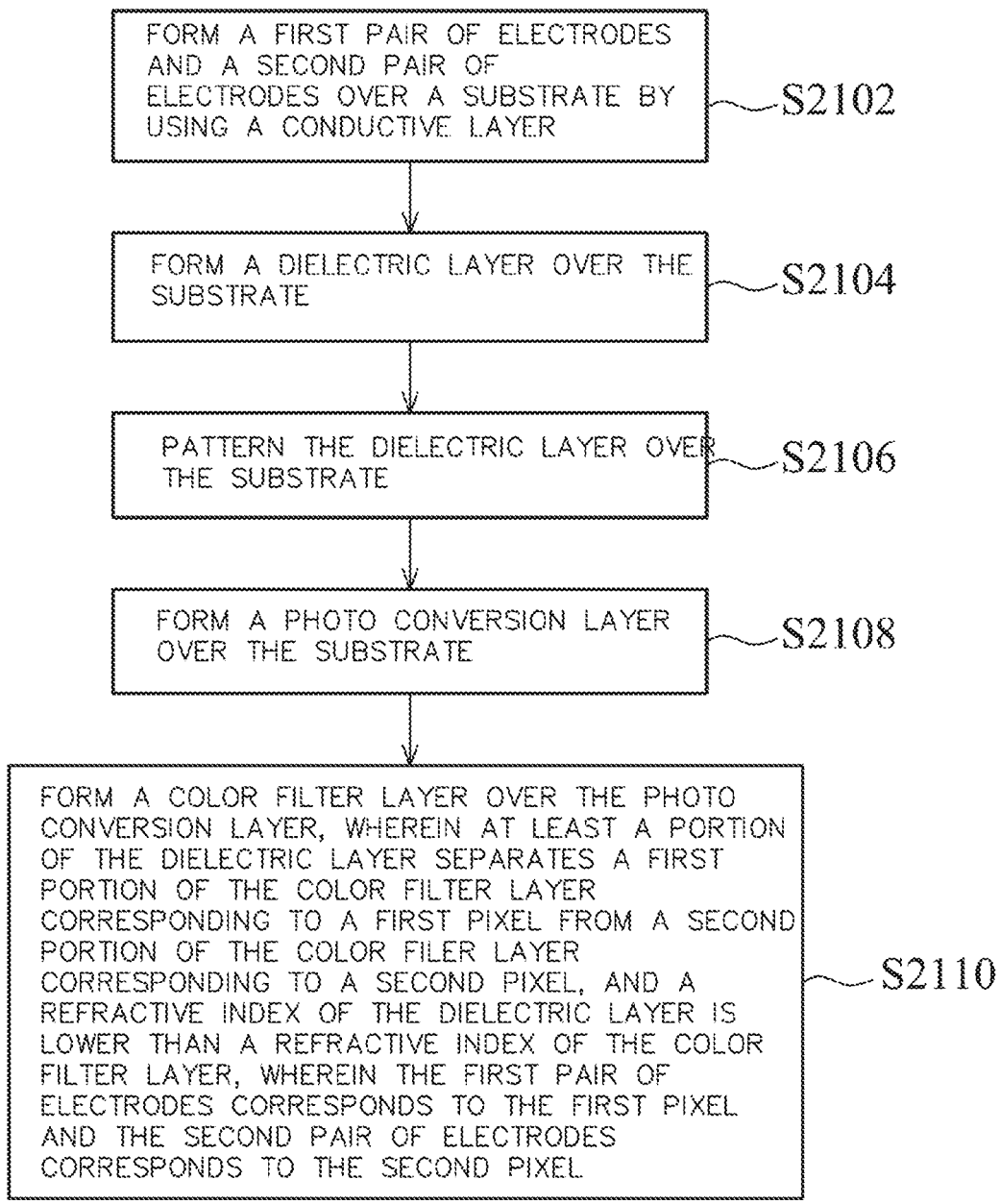
FIG. 21 is a flow chart for forming a photo diode according to a first exemplary embodiment of the invention.

FIG. 21 is a flow chart for forming a photo diode according to a first exemplary embodiment of the invention. As shown in FIG. 21, the method 2100 for forming a photo diode is provided. The method 2100 may include the following procedures: forming a first pair of electrodes and a second pair of electrodes over a substrate by using a conductive layer (S2102); forming a dielectric layer over the substrate (S2104); patterning the dielectric layer over the substrate (S2106); forming a photo conversion layer over the substrate (S2108); and forming a color filter layer over the photo conversion layer, wherein at least a portion of the dielectric layer separates a first portion of the color filter layer corresponding to a first pixel from a second portion of the color filter layer corresponding to a second pixel, and a refractive index of the dielectric layer is lower than a refractive index of the color filter layer, wherein the first pair of electrodes corresponds to the first pixel and the second pair of electrodes corresponds to the second pixel (S2110).

Figure 22:
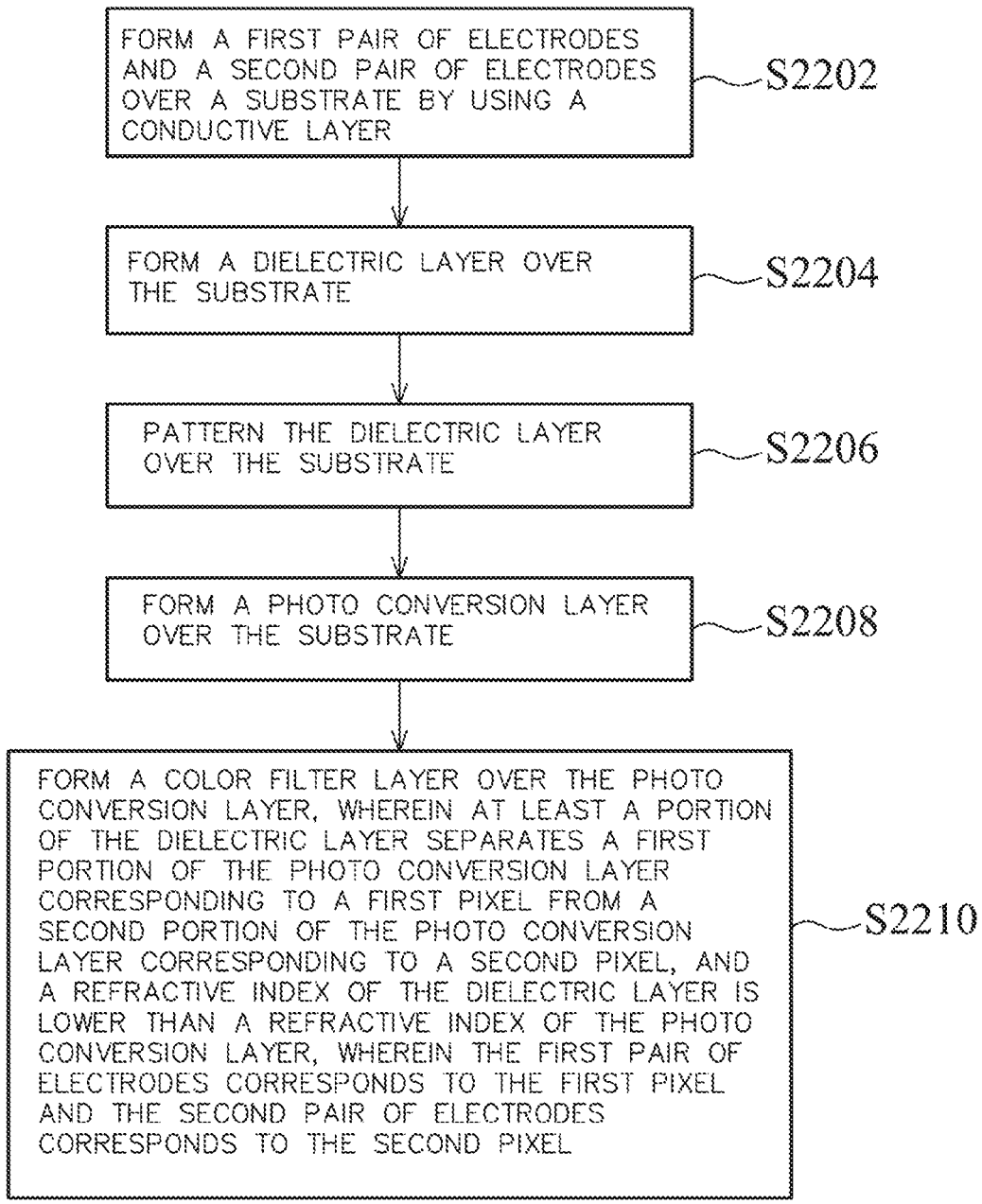
FIG. 22 is a flow chart for forming a photo diode according to a second exemplary embodiment of the invention.

FIG. 22 is a flow chart for forming a photo diode according to a second exemplary embodiment of the invention. As shown in FIG. 22, the method 2200 for forming a photo diode is provided. The method 2200 may include the following procedures: forming a first pair of electrodes and a second pair of electrodes over a substrate by using a conductive layer (S2202); forming a dielectric layer over the substrate (S2204); patterning the dielectric layer over the substrate (S2206); forming a photo conversion layer over the substrate (S2208); and forming a color filter layer over the photo conversion layer, wherein at least a portion of the dielectric layer separates a first portion of the photo conversion layer corresponding to a first pixel from a second portion of the photo conversion layer corresponding to a second pixel, and a refractive index of the dielectric layer is lower than a refractive index of the photo conversion layer, wherein the first pair of electrodes corresponds to the first pixel and the second pair of electrodes corresponds to the second pixel (S2210).

An exemplary photo diode comprises a pixel unit that includes a pair of pixels, a photo conversion layer that is above the pixel unit and that has a pair of portions, each of which corresponds to a respective one of the pixels, and a dielectric layer that is between the portions of the photo conversion layer.

Another exemplary photo diode comprises a pixel unit that includes a pair of pixels, a color filter that is above the pixel unit and that has a pair of portions, each of which corresponds to a respective one of the pixels, and a dielectric layer that is between the portions of the color filter.

An exemplary method of manufacturing a photo diode comprises forming a pixel unit that includes a pair of pixels, forming a dielectric layer above the pixel unit, forming above the pixel unit a photo conversion layer and a color filter, each of which has a pair of portions that respectively correspond to the pixels, and patterning the dielectric layer such that the dielectric layer is between the portions of at least one of the photo conversion layer and the color filter.

An exemplary method includes forming a dielectric layer over a substrate. The dielectric layer is patterned to form a plurality of openings in the dielectric layer. A photo conversion layer and a color filter layer are formed in the plurality of openings. An interface between the photo conversion layer and the color filter layer is below a topmost surface of the dielectric layer.

An exemplary method includes forming an electrode layer over a substrate. A dielectric layer is formed over the electrode layer. The dielectric layer is patterned to form a plurality of openings in the dielectric layer. A photo conversion layer is formed in the plurality of openings. A topmost surface of the photo conversion layer is below a topmost surface of the dielectric layer. A color filter layer is formed in remaining portions of the plurality of openings.

An exemplary method includes forming a plurality of electrodes over a substrate. A dielectric layer is formed over the plurality of electrodes. The dielectric layer is etched to form a first opening and a second opening in the dielectric layer. The first opening exposes a first pair of the plurality of electrodes. The second opening exposes a second pair of the plurality of electrodes. A first photo conversion layer is formed in the first opening. A thickness of the first photo conversion layer is less than a thickness of the dielectric layer. A second photo conversion layer is formed in the second opening. A thickness of the second photo conversion layer is less than the thickness of the dielectric layer. A first color filter layer is formed over the first photo conversion layer. A second color filter layer is formed over the second photo conversion layer. A portion of the dielectric layer is interposed between the first color filter layer and the second color filter layer.

An exemplary semiconductor structure includes a photo conversion layer over a substrate, a color filter over and in physical contact with the photo conversion layer, and a dielectric layer surrounding the photo conversion layer and the color filter. A topmost surface of the dielectric layer is above an interface between the photo conversion layer and the color filter.

An exemplary semiconductor structure includes a photo conversion layer over a substrate, a color filter over the photo conversion layer, and a dielectric layer extending along and in physical contact with sidewalls of the photo conversion layer and sidewalls of the color filter. A topmost surface of the dielectric layer is above a topmost surface of the photo conversion layer.

An exemplary semiconductor structure includes a pair of electrodes over a substrate, a photo conversion layer over the pair of electrodes, a color filter over the photo conversion layer, a dielectric layer surrounding the photo conversion layer and the color filter, and a micro lens over and in physical contact with the color filter and the dielectric layer. A thickness of the dielectric layer is greater than a thickness of the photo conversion layer.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation.

Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A semiconductor structure comprising:
   a photo conversion layer over a substrate;
   a color filter over and in physical contact with the photo conversion layer, wherein the photo conversion layer and the color filter have a same width; and
   a dielectric layer surrounding the photo conversion layer and the color filter, a topmost surface of the dielectric layer being above an interface between the photo conversion layer and the color filter.

2. The semiconductor structure of claim 1, further comprising a micro lens in physical contact with the topmost surface of the dielectric layer and a topmost surface of the color filter.

3. The semiconductor structure of claim 1, wherein the dielectric layer is in physical contact with sidewalls of the photo conversion layer and sidewalls of the color filter.

4. The semiconductor structure of claim 1, further comprising a pair of electrodes interposed between the substrate and the photo conversion layer.

5. The semiconductor structure of claim 1, wherein the photo conversion layer comprises an organic film.

6. The semiconductor structure of claim 1, wherein a refractive index of the dielectric layer is less than a refractive index of the photo conversion layer.

7. The semiconductor structure of claim 6, wherein the refractive index of the dielectric layer is less than a refractive index of the color filter.

8. A semiconductor structure comprising:
   a photo conversion layer over a substrate;
   a color filter over and in physical contact with the photo conversion layer; and
   a dielectric layer extending along and in physical contact with sidewalls of the photo conversion layer and sidewalls of the color filter, a topmost surface of the dielectric layer being above a topmost surface of the photo conversion layer.

9. The semiconductor structure of claim 8, further comprising a plurality of electrodes interposed between the substrate and the photo conversion layer.

10. The semiconductor structure of claim 9, further comprising a plurality of conductive vias over the substrate, wherein each of the plurality of conductive vias is in physical contact with a corresponding one of the plurality of electrodes.

11. The semiconductor structure of claim 8, further comprising a micro lens over the dielectric layer and the color filter.

12. The semiconductor structure of claim 8, wherein a refractive index of the color filter is between about 1.6 to about 2.

13. The semiconductor structure of claim 12, wherein a refractive index of the photo conversion layer is between about 1.6 to about 2.

14. The semiconductor structure of claim 13, wherein a refractive index of the dielectric layer is less than about 1.5.

15. A semiconductor structure comprising:
a pair of electrodes over a substrate;
a photo conversion layer over the pair of electrodes;
a color filter over the photo conversion layer, wherein the photo conversion layer and the color filter have a same width;
a dielectric layer surrounding the photo conversion layer and the color filter, a thickness of the dielectric layer being greater than a thickness of the photo conversion layer; and
a micro lens over and in physical contact with the color filter and the dielectric layer.

16. The semiconductor structure of claim 15, wherein a thickness of the color filter is between about 0.3 µm and about 1 µm.

17. The semiconductor structure of claim 15, wherein the dielectric layer is in physical contact with sidewalls of the photo conversion layer, sidewalls of the color filter and a bottom surface of the micro lens.

18. The semiconductor structure of claim 15, wherein a first electrode of the pair of electrodes is laterally spaced apart from a second electrode of the pair of electrodes.

19. The semiconductor structure of claim 15, further comprising a pair of conductive vias interposed between the photo conversion layer and the substrate, wherein a first conductive via of the pair of conductive vias is in physical contact with a first electrode of the pair of electrodes, and wherein a second conductive via of the pair of conductive vias is in physical contact with a second electrode of the pair of electrodes.

20. The semiconductor structure of claim 15, wherein the photo conversion layer comprises an organic material.

* * * * *